(12) United States Patent
Kitazawa et al.

(10) Patent No.: US 6,667,221 B2
(45) Date of Patent: Dec. 23, 2003

(54) METHOD OF MANUFACTURING SEMICONDUCTOR DEVICE

(75) Inventors: Masashi Kitazawa, Tokyo (JP); Tomohiro Yamashita, Tokyo (JP); Takashi Kuroi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/212,274

(22) Filed: Aug. 6, 2002

(65) Prior Publication Data

US 2003/0157755 A1 Aug. 21, 2003

(30) Foreign Application Priority Data

Feb. 19, 2002 (JP) ........................................ 2002-041553

(51) Int. Cl.⁷ ........................ H01L 21/76; H01L 21/326; H01L 23/544
(52) U.S. Cl. ........................ 438/401; 438/424; 438/427; 438/467; 438/975; 257/797
(58) Field of Search ................................. 438/401, 424, 438/975, 462, 427; 257/797

(56) References Cited

U.S. PATENT DOCUMENTS 5,893,744 A * 4/1999 Wang ........................... 438/401

6,127,737 A 10/2000 Kuroi et al.

FOREIGN PATENT DOCUMENTS

| JP | 11-54607 | 2/1999 |
| JP | 2001-52993 | 2/2001 |

* cited by examiner

*Primary Examiner*—Wael Fahmy
*Assistant Examiner*—Shrinivas H. Rao
(74) *Attorney, Agent, or Firm*—Oblon, Spivak, McClelland, Maier & Neustadt, P.C.

(57) ABSTRACT

A technique for preventing a decrease in alignment accuracy during a photolithography process is provided. A substrate (1) is prepared, in the surface (80) of which trenches (7) for use as alignment marks and trenches (17, 27) each forming an element isolation structure are formed and on the surface (80) of which a polysilicon film (3) is formed, avoiding the trenches (7, 17, 27). The trenches (7, 17, 27) are filled with an insulation film (30). The insulation film (30) is then selectively etched to partially remove the insulation film (30) in the trenches (7) and to leave the insulation film (30) on side and bottom surfaces (81, 82) of the trenches (7). Using the insulation film (30) in the trenches (7) as a protective film, the polysilicon film (3) is selectively etched. The use of the insulation film (30) in the trenches (7) as a protective film prevents the substrate (1) from being etched and thereby prevents the shape of the trenches (7) from being changed. This results in prevention of a decrease in alignment accuracy during a photolithography process.

10 Claims, 24 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device including a substrate, in the surface of which a trench for use as an alignment mark is formed, and also relates to a semiconductor device including such a substrate.

2. Description of the Background Art

Generally, semiconductor devices are formed by a repetitive sequence of film deposition, photolithography, machining and ion implantation processes performed on a silicon substrate. To stack a plurality of patterns formed by the photolithography process in layers for formation of a semiconductor device, it is important to achieve accurate alignment of the patterns in the photolithography process repeated several times.

In many semiconductor devices, an element isolation structure such as a LOCOS (Local Oxidation of Silicon) or STI (Shallow Trench Isolation) structure is initially formed in a silicon substrate and used as an alignment mark for alignment in the photolithography process. FIG. 23 is a plan view illustrating in schematic form element isolation structures 101a and 101b for use as alignment marks, and FIG. 24 is a cross-sectional view taken along lines A—A indicated by arrows in FIG. 23. FIG. 23 shows the element isolation structures 101a and 101b when viewed from a direction perpendicular to the surface of a substrate 100.

As shown in FIGS. 23 and 24, the element isolation structures 101a and 101b each include a trench 102 formed in the surface of the substrate 100 and an insulation film 103 filled in the trench 102. The trench 102 of the element isolation structure 101a partitions off a generally square part of the active region of the substrate 100, and the trench 102 of the element isolation structure 101b further partitions off a generally square part of the active region of the substrate 100 partitioned off by the trench 102 of the element isolation structure 101a. FIG. 24 is a cross-sectional view of the element isolation structures 101a and 101b adopting, for example, an STI structure. Hereinafter, the element isolation structures 101a and 101b may be generically referred to as "element isolation structures 101".

In the use of the aforementioned element isolation structures 101 as alignment marks, alignment becomes difficult in the following case. When, as shown in FIG. 25, a metal layer 104 is formed on the substrate 100 to cover the surface of the insulation film 103, light reflection from the metal layer 104 and a small difference in surface level between the substrate 100 and the insulation film 103 make optical detection of the alignment marks difficult. One example of the case where the metal layer 104 is formed on the substrate 100 is the case when a metal or metal silicide is adopted as a gate electrode material of a MOS transistor.

One way to avoid this problem is, as shown in FIG. 26, to use trenches 105a and 105b formed in the surface of the substrate 100 as alignment marks. The trenches 105a and 105b can be formed by etching the insulation films 103 of the element isolation structures 101 shown in FIG. 24.

By in this way using the trenches 105a and 105b as alignment marks, a sufficient difference in level of the surface of the substrate 100 can be ensured even when the metal layer 104 reflecting light is formed on the whole surface of the substrate 100 as shown in FIG. 27. This allows easy optical detection of the alignment marks. For easier detection of the alignment marks, the trenches 105a and 105b for use as alignment marks are preferably trenches of an STI structure which forms a difference in level perpendicular to the substrate rather than those of a LOCOS structure which forms a difference in level gently sloping to the substrate. Hereinafter, the trenches 105a and 105b are generically referred to as "trenches 105".

However, even the use of the trenches 105 as alignment marks has the following problem. In the photolithography process, if a resist is formed on the substrate 100 to fill the trenches 105 with the resist, depending on the relationship between a depth of the trenches 105 from the surface of the substrate 100 and a wavelength of illumination light for use in alignment mark detection, alignment marks may not be detected due to interference of the illumination light.

To eliminate this problem, Japanese Patent Application Laid-open No. 2001-52993 discloses a technique for forming both the aforementioned element isolation structures 101 and trenches 105 in the substrate 100 and then selecting either the element isolation structures 101 or the trenches 105 to be used as alignment marks at each process step.

However, either when only the trenches 105 are formed in the substrate 100 or when both the element isolation structures 101 and the trenches 105 are formed in the substrate 100 as above described, the use of the trenches 105 as alignment marks still has the following problem. If nonselective etching to the substrate 100 is performed with the surfaces of the trenches 105 exposed, the substrate 100 will be etched and thereby the shapes of the trenches 105 will be changed from their design value. Using such shape-changed trenches 105 as alignment marks causes a decrease in alignment accuracy in the subsequent photolithography process.

SUMMARY OF THE INVENTION

It is an object of the present invention to provide a technique for preventing a decrease in alignment accuracy in a photolithography process.

According to an aspect of the present invention, a method of manufacturing a semiconductor device includes the following steps (a) to (c). The step (a) is to prepare a substrate having a surface in which a first trench for use as an alignment mark is formed and on which a first film is formed, avoiding the first trench. The step (b) is to form a second film on side and bottom surfaces of the first trench. The step (c) is to selectively etch the first film using the second film as a protective film.

Using the second film as a protective film during etching of the first film prevents the side and bottom surfaces of the first trench from being etched during the etching of the first film. From this, the shape of the first trench for use as an alignment mark will never be changed, which prevents a decrease in alignment accuracy during the photolithography process.

According to another aspect of the present invention, a method of manufacturing a semiconductor device includes the following steps (a) to (c). The step (a) is to prepare a substrate, in a surface of which a trench for use as an alignment mark is formed. The step (b) is to form a gate electrode material on the substrate to cover the trench. The step (c) is to selectively etch the gate electrode material while leaving the gate electrode material formed on the trench, to selectively form a gate structure on the substrate.

Since the gate electrode material formed on the trench will not be etched, it is possible to prevents a situation in which the gate electrode material, when being selectively etched, remains in the trench. This results in prevention of a decrease in alignment accuracy during the photolithography process.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

FIGS. 1 to 11 are cross-sectional views illustrating the manufacturing process of a semiconductor device according to a first preferred embodiment of the present invention. Referring to FIGS. 1 to 11, a method of manufacturing a semiconductor device according to the first preferred embodiment will be described as follows.

Figure 1:
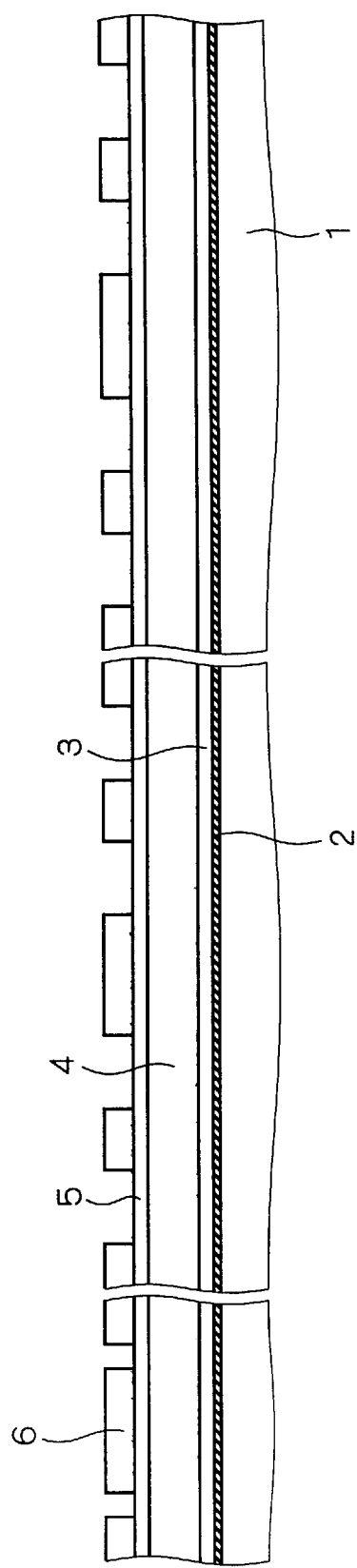
FIGS. 1 to 11 are cross-sectional views illustrating the manufacturing process of a semiconductor device according to a first preferred embodiment of the present invention.
Figure 2:
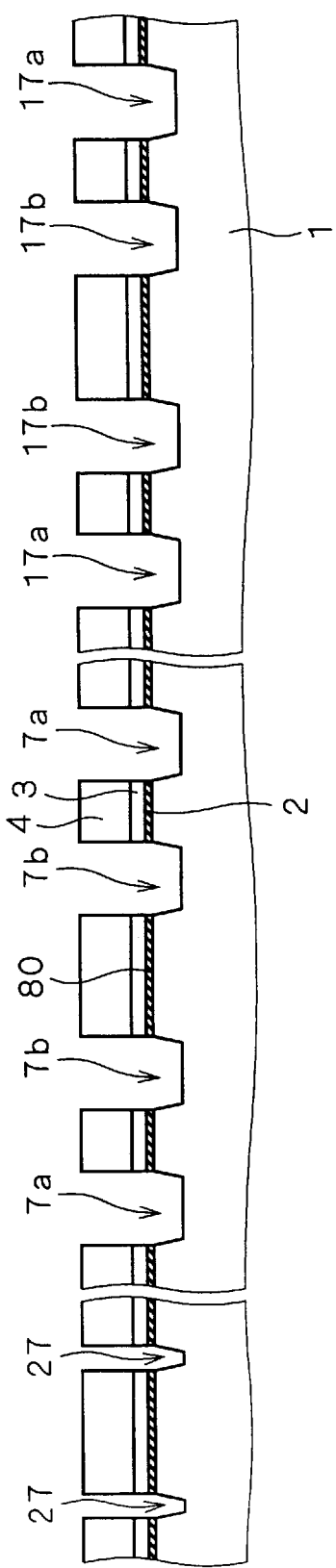
Figure 23:
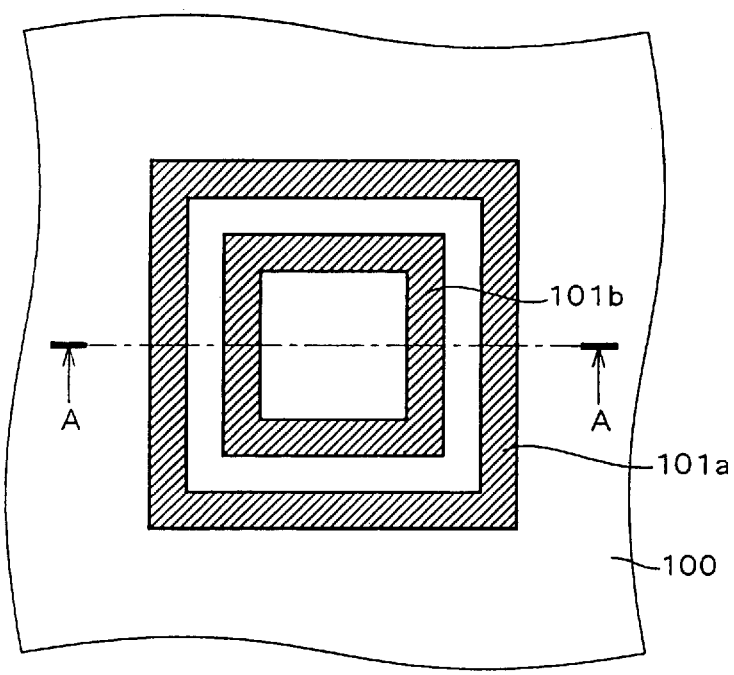
FIGS. 23 to 25 are cross-sectional views illustrating in schematic form element isolation structures 101 for use as alignment marks.
Figure 24:
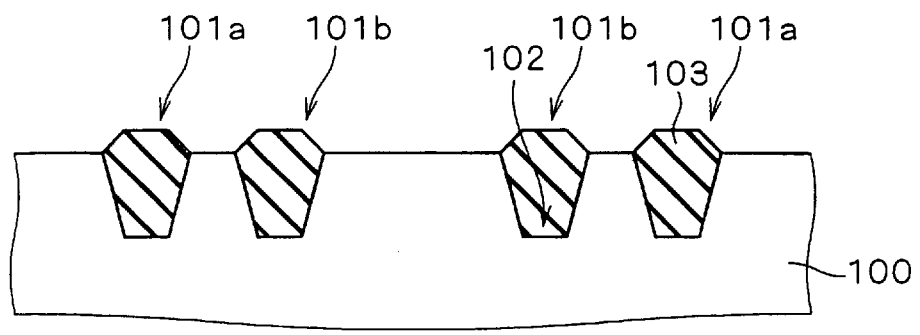
Figure 25:
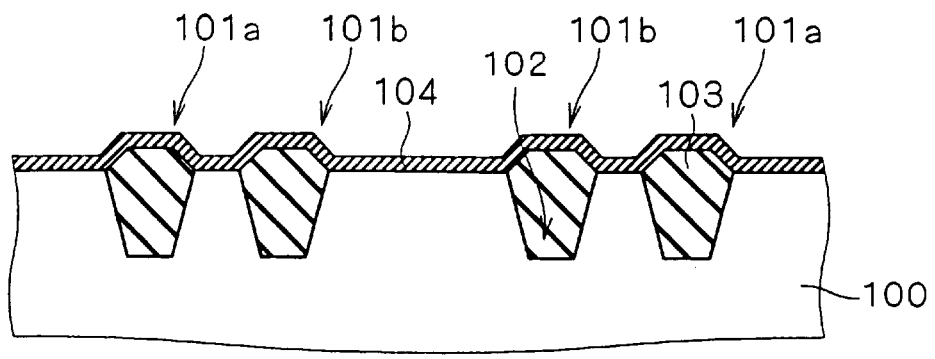
Figure 26:
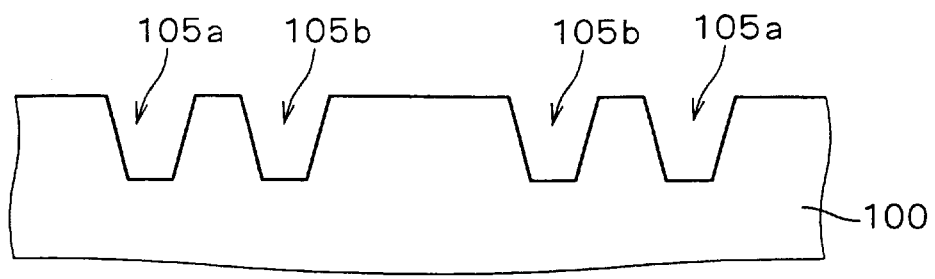
FIGS. 26 and 27 are cross-sectional views illustrating in schematic form the structures of trenches 105 for use as alignment marks.
Figure 27:
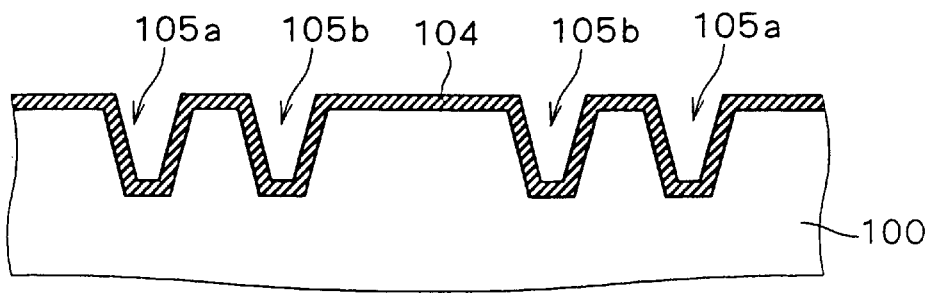

First, as shown in FIGS. 1 and 2, a substrate 1 is prepared, in a surface 80 of which trenches 7a and 7b, and trenches 17a, 17b and 27 each forming an element isolation structure are formed and on the surface 80 of which an underlying oxide film 2, a polysilicon film 3 and a silicon nitride film 4 are stacked in layers in this order, avoiding the trenches 7a, 7b, 17a, 17b and 27. The trenches 7a and 7b are trenches for use as alignment marks. Like the aforementioned trenches 102 of the element isolation structures 101a and 101b shown in FIGS. 23 and 24, the trench 7a partitions off, for example, a generally square part of an active region of the substrate 1, and the trench 7b further partitions off a generally square part of the active region partitioned off by the trench 7a. The trenches 17a and 17b are trenches each forming an element isolation structure for use as an alignment mark. Like the trenches 7a and 7b, the trench 17a partitions off, for example, a generally square part of the active region of the substrate 1 and the trench 17b further partitions off a generally square part of the active region partitioned off by the trench 17a. The trench 27 is a trench forming an element isolation structure which provides actual isolation between semiconductor elements and partitions off, for example, a generally square part of the active region of the substrate 1. Hereinafter, the trenches 7a and 7b may be generically referred to as "trenches 7", and the trenches 17a and 17b as "trenches 17".

To describe the steps of FIGS. 1 and 2 in more detail, as shown in FIG. 1, the substrate 1 which is for example a silicon substrate is thermally oxidized to form the underlying oxide film 2 to a thickness of approximately 5 to 50 nm and the polysilicon film 3 is formed thereon to a thickness of approximately 5 to 100 nm. The polysilicon film 3 may be replaced by an amorphous silicon film. Then, the silicon nitride film 4 is deposited to a thickness of approximately 50 to 200 nm on the polysilicon film 3. Further, an antireflective film 5 such as a plasma nitride film is stacked on the polysilicon film 3 according to required specifications in the photolithography process, and a resist 6 with a predetermined pattern is formed on the antireflective film 5. The antireflective film 5 is a film which is formed to prevent illumination light for use in exposure in the photolithography process from being reflected off the underlying multilayer structure.

Then, as shown in FIG. 2, using the resist 6 as a mask, the antireflective film 5, the silicon nitride film 4, the polysilicon film 3, the underlying oxide film 2 and the substrate 1 are selectively etched to form the trenches 7, 17 and 27 in the surface 80 of the substrate 1. At this time, the trenches 7, 17 and 27 have depths of, for example, 200 to 500 nm from the surface 80 of the substrate 1. Then, the resist 6 and the antireflective film 5 are removed. In this way, the substrate 1 with the trenches 7, 17 and 27, the underlying oxide film 2, the polysilicon film 3 and the silicon nitride film 4 is prepared.

Figure 3:
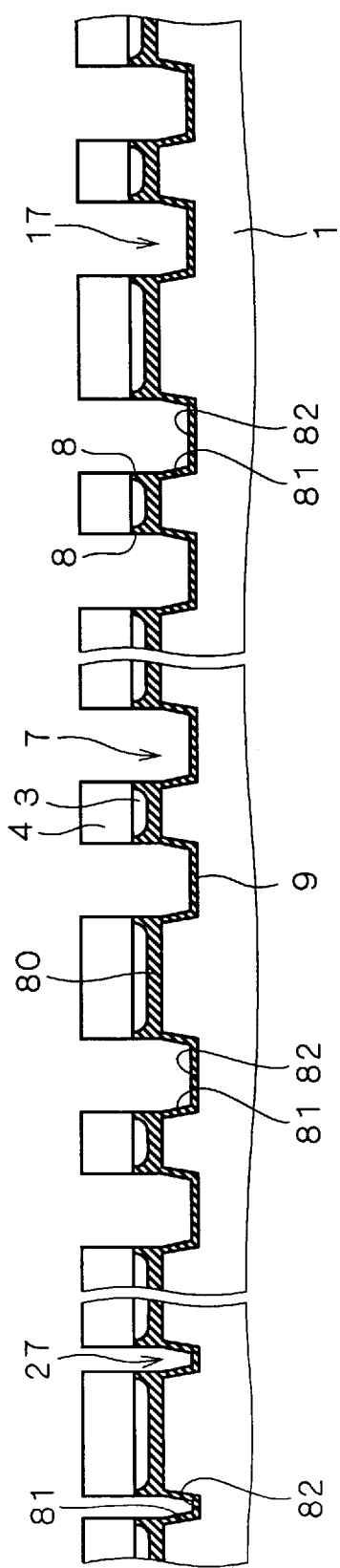
Figure 4:
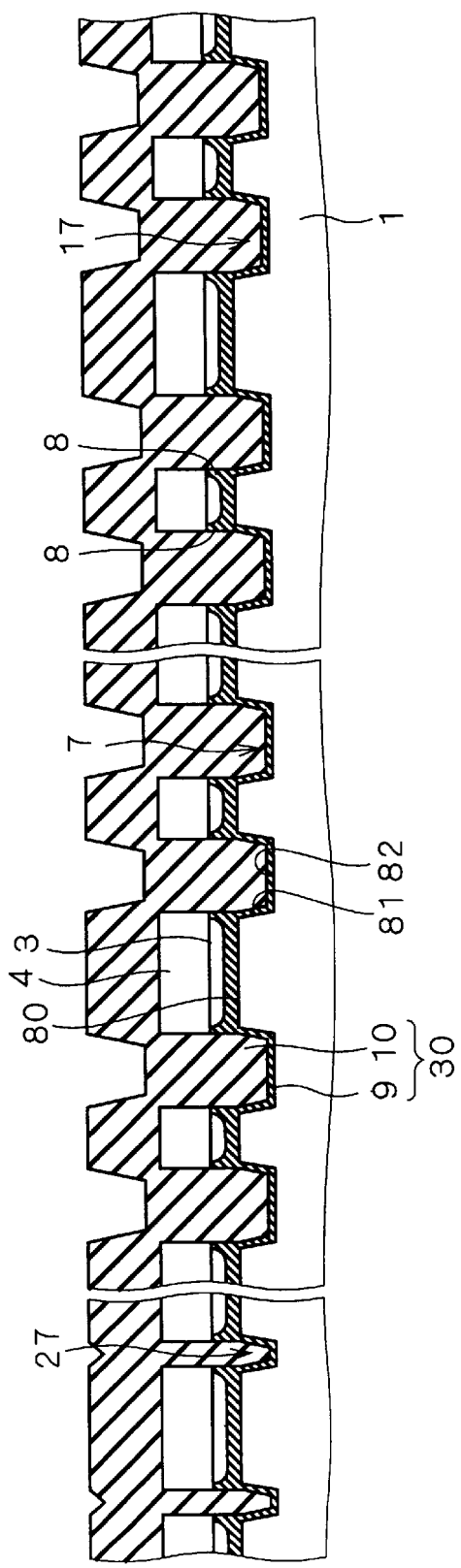

Referring next to FIGS. 3 to 9, an insulation film is formed on side surfaces 81 and bottom surfaces 82 of the trenches 7. More specifically, as shown in FIGS. 3 and 4, an insulation film 30 is formed on the whole surface of the substrate 1 to fill the trenches 7, 17 and 27 with the insulation film 30. To be more specific, as shown in FIG. 3, an oxidation process is performed on the structure obtained at the process step shown in FIG. 2, for avoiding etching damage to the side and bottom surfaces 81 and 82 of the trenches 7, 17 and 27. By this oxidation process, the polysilicon film 3 is partially oxidized, forming bird's beaks 8. A silicon oxide film formed by the oxidation process of FIG. 3 on the side and bottom surfaces 81 and 82 of the trenches 7, 17 and 27, oxidized portions of the polysilicon film 3, and the underlying oxide film 2 are generically referred to as an "insulation film 9". The insulation film 9 formed on the side and bottom surfaces 81 and 82 of the trenches 7, 17 and 27 has a thickness of approximately 10 to 50 nm. Then, as shown in FIG. 4, an insulation film 10 of, for example, silicon oxide film is formed on the substrate 1 by HDP-CVD (High Density Plasma-Chemical Vapor Deposition) or the like, whereby the insulation film 30 consisting of the insulation films 9 and 10 is formed on the whole surface of the substrate 1 and the trenches 7, 17 and 27 are filled with the insulation film 30. The bird's beaks 8 formed by partial oxidation of the polysilicon film 3 are provided to prevent end portions of the upper surface of the insulation film 30 in a finished element isolation structure from being sunk below the surface 80 of the substrate 1 due to etching of the insulation film 30 in subsequent process steps.

Generally in the formation of an element isolation structure such as STI, a process called "pre-etching" is performed after an insulation film is formed on the whole surface of a substrate to fill in trenches formed in the surface of the substrate and before planarization of the insulation film. The "pre-etching process" is a process for etching the insulation film on active regions of the substrate partitioned off by the trenches before planarization of the insulation film, in order to reduce the amount of polishing of the insulation film at the time of planarization thereof.

If the insulation film for filling in the trenches of the element isolation structures is planarized by CMP (Chemical Mechanical Polishing) immediately after being formed on the whole substrate surface, central portions of the upper surface of the insulation film on the trenches forming the element isolation structures may be cut away due to, for example, sag of a polishing cloth for use in CMP, which may result in a V-shaped upper surface of the insulation film. This phenomenon is called "dishing", which can impair inplane uniformity of the film thickness of the insulation film in the element isolation structures. To avoid this dishing, in the formation of the element isolation structures, the insulation film on the active regions of the substrate partitioned off by the trenches is etched before planarization. In this first preferred embodiment, the pre-etching process and the process for partially removing the insulation film 30 in the trenches 7 to leave the insulation film 30 on the side and bottom surfaces 81 and 82 of the trenches 7 are performed in a single process step.

Figure 5:
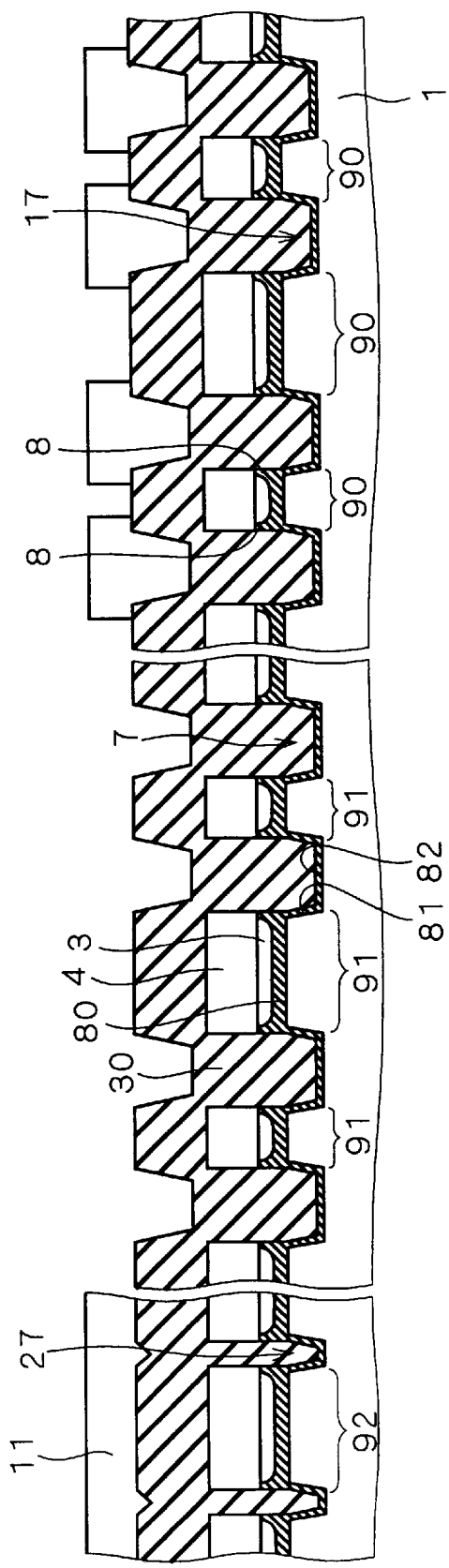
Figure 6:
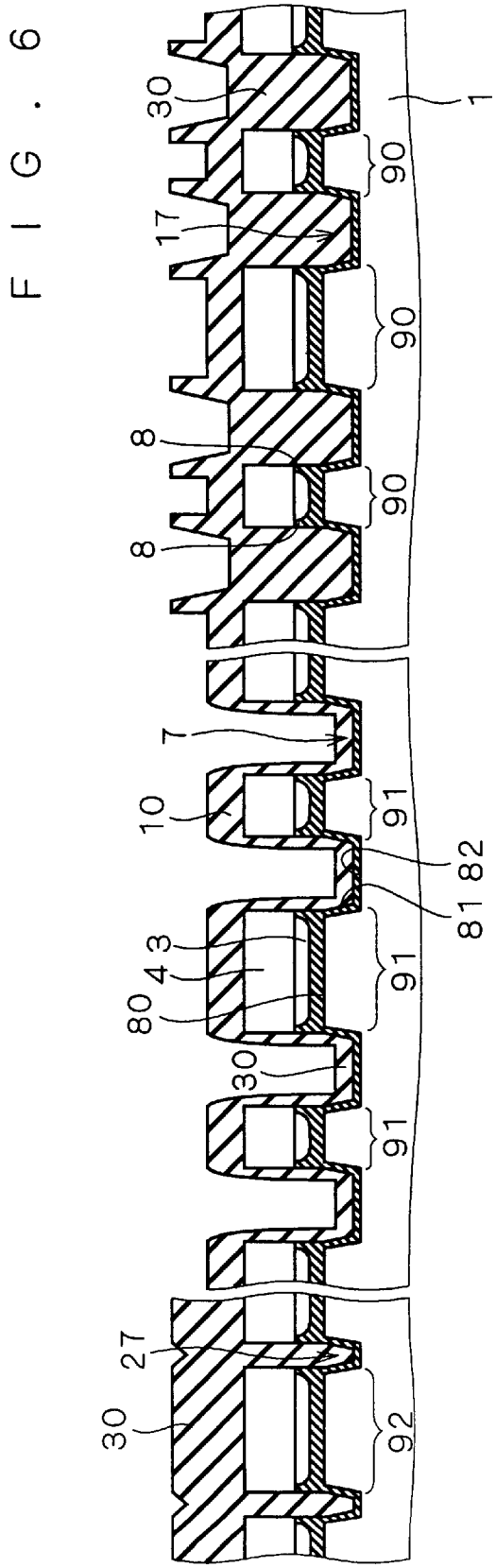

More specifically, FIGS. 5 and 6 illustrate the process for selectively etching the insulation film 30 to partially remove the insulation film 30 in the trenches 7, thereby to leave the insulation film 30 on the side and bottom surfaces 81 and 82 of the trenches 7. In the same process step, the pre-etching process is performed. As shown in FIG. 5, a resist 11 is formed on the insulation film 30 to expose the insulation film 30 on the trenches 7, the insulation film 30 on active regions 91 of the substrate 1 partitioned off by the trenches 7 and the insulation film 30 on active regions 90 of the substrate 1 partitioned off by the trenches 17. In the specification of the present invention, the active regions 91 partitioned off by the trenches 7 include, in FIG. 2, both the active region partitioned off by the trenches 7a and 7b and the active region partitioned off by the trench 7b. Similarly, the active regions 90 partitioned off by the trenches 17 include, in FIG. 2, both the active region partitioned off by the trenches 17a and 17b and the active region partitioned off by the trench 17b.

The insulation film 30 is then, as shown in FIG. 6, selectively etched by anisotropic etching using the resist 11 as a mask to partially remove the insulation film 30 in the trenches 7, whereby the insulation film 30 on the side and bottom surfaces 81 and 82 of the trenches 7 is left and part of the insulation film 30 on the active regions 90 and 91 of the substrate 1 is removed. Anisotropic etching employed herein is, for example, reactive ion etching. The film thickness of the insulation film 30 to be left on the side and bottom surfaces 81 and 82 of the trenches 7 is determined so that the substrate 1 in the trenches 7 will not be exposed due to etching in subsequent process steps. The amount of etching is controlled such that the insulation film 30 with a thickness of approximately 50 to 150 nm will be left in the trenches 7, for example. At this time, the silicon nitride film 4 acts as an etch stopper. In the process step shown in FIGS. 5 and 6, the insulation film 30 on the active regions 90 of the substrate 1 partitioned off by the trenches 17, out of the trenches 17 and 27 forming element isolation structures, is etched. However, depending on the width of an active region 92, the insulation film 30 on the active region 92 of the substrate 1 partitioned off by the trench 27, which forms an element isolation structure providing isolation between semiconductor elements, may also be etched by the pre-etching process.

Figure 7:
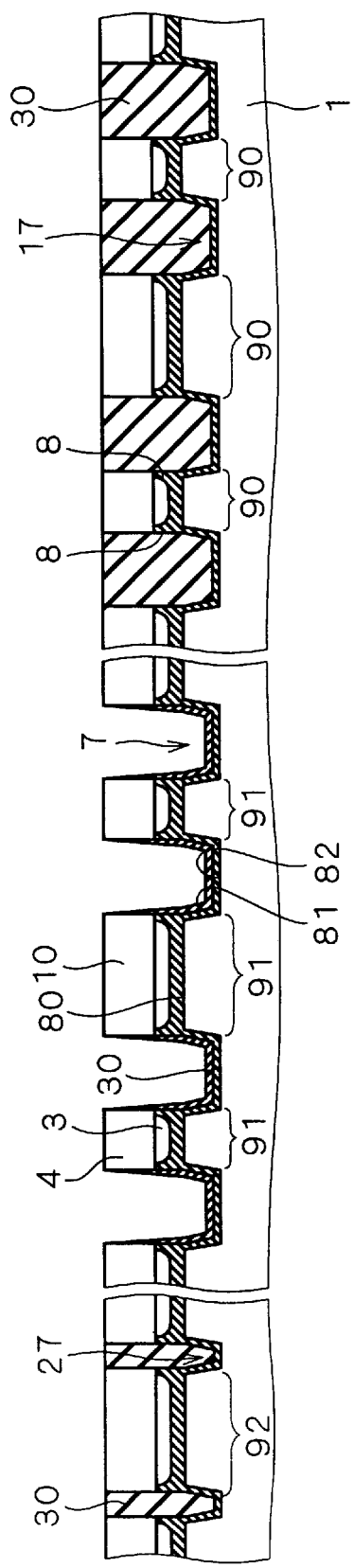
Figure 8:
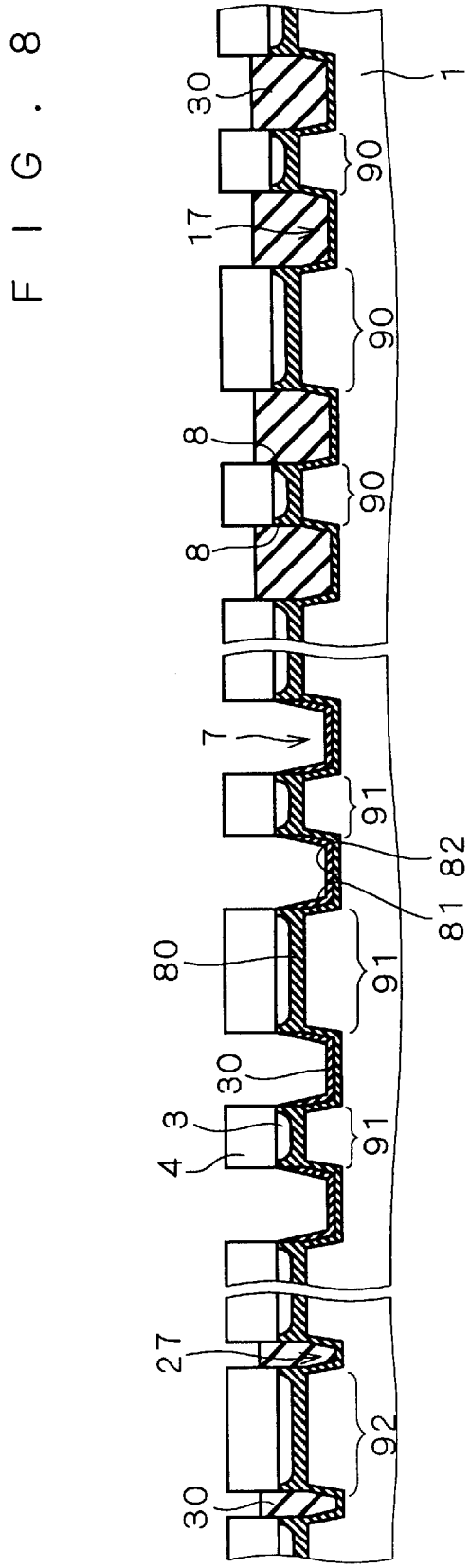
Figure 9:
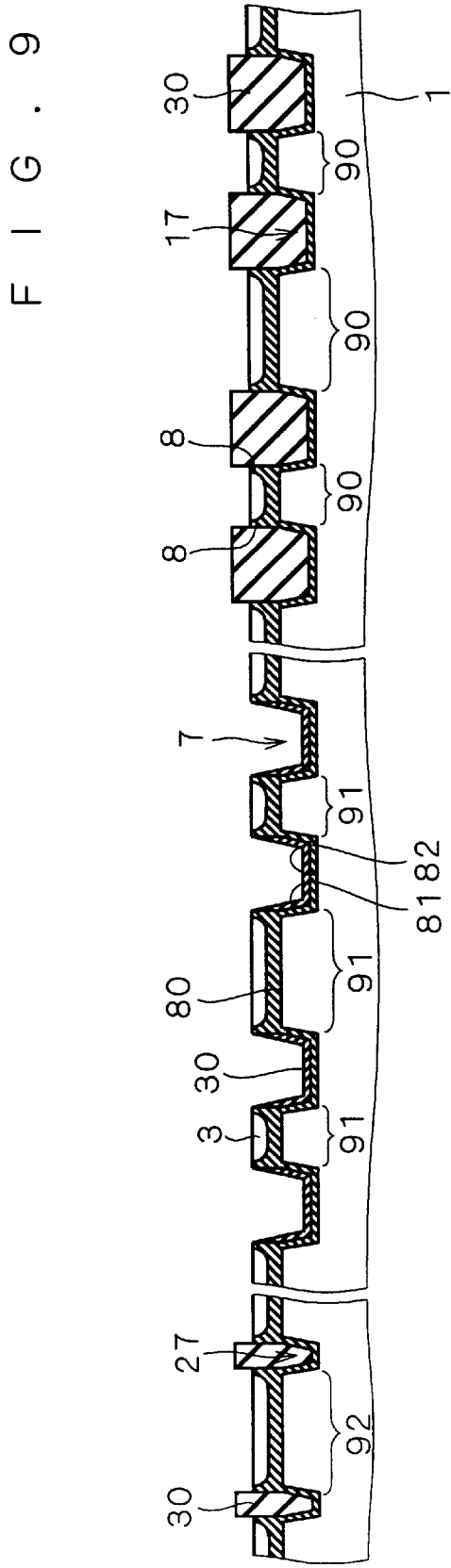

Then, as shown in FIG. 7, the insulation film 30 is planarized by CMP. As shown in FIG. 8, the insulation film 30 is etched by wet processing for the purpose of removing the insulation film 30 deposited on the side surface of the silicon nitride film 4 and as shown in FIG. 9, the silicon nitride film 4 is removed by wet processing. In this way, the insulation film is formed on the side and bottom surfaces 81 and 82 of the trenches 7.

Figure 10:
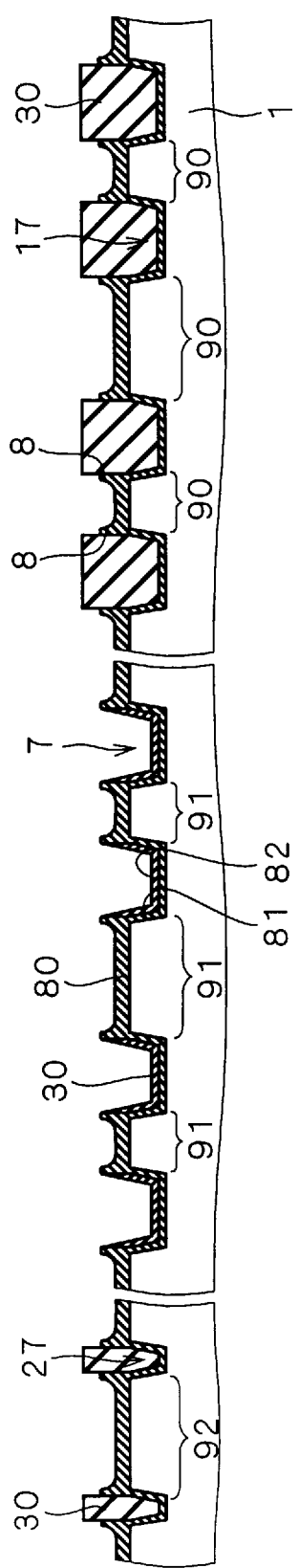
Figure 11:
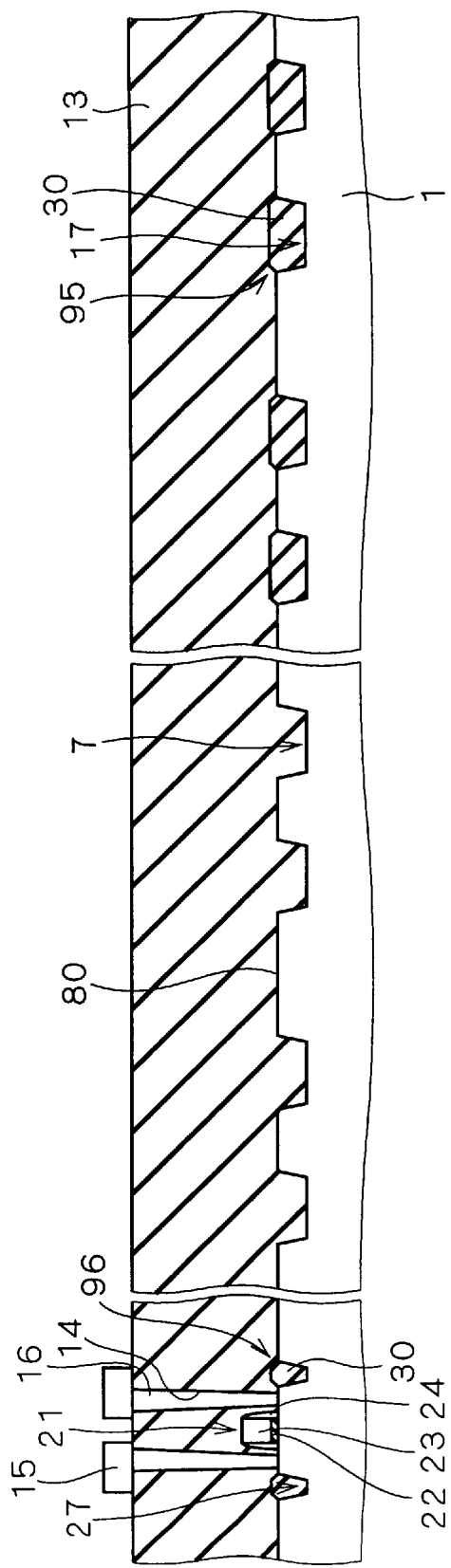

Next, as shown in FIG. 10, the polysilicon film 3 is selectively etched for removal using the insulation film 30 as a protective film for the substrate 1. At this time, etching is performed using a ammonia-containing solution. Then, as shown in FIG. 11, the insulation film 30 on the active regions 90 to 92 and the insulation film 30 on the trenches 7 are removed, which completes the element isolation structures. In FIG. 11, the trenches 17 and the insulation film 30 filled in the trenches 17 form element isolation structures 95 for use as alignment marks, and the trench 27 and the insulation film 30 filled in the trench 27 form an element isolation structure 96 which provides actual isolation between semiconductor elements.

Then, using the trenches 7 or the element isolation structures 95 as alignment marks, a gate structure 21 of, for example, a MOS transistor including a gate insulating film 22, a gate electrode 23 and a sidewall 24 is selectively formed on the active region 92 of the substrate 1. Then, an interlayer insulation film 13 of BPTEOS (boro-phospho tetraethyl orthosilicate) film which is for example, a boron- and phosphorous-doped silicon oxide film is formed on the substrate 1, a contact hole 14 is formed in the interlayer insulation film 13, and a contact plug 16 is embedded in the contact hole 14. After that, an interconnection 15 is formed in contact with the contact plug 16 on the interlayer insulation film 13.

As above described, in the semiconductor device manufacturing method according to this first preferred embodiment, the insulation film 30 is used as a protective film during etching of the polysilicon film 3. Etching performed for removal of the polysilicon film 3 is generally non-selective to the substrate 1 which is a silicon substrate; therefore, if no insulation film 30 is formed on the side and bottom surfaces 81 and 82 of the trenches 7, the surfaces of the trenches 7 may also be etched by the etching of the polysilicon film 3 and thereby the shapes of the trenches 7 may be changed from their design value. In the semiconductor device manufacturing method according to the first preferred embodiment, however, the insulation film 30 is formed on the side and bottom surfaces 81 and 82 of the trenches 7 for use as a protective film during the etching of the polysilicon film 3 and thus, the side and bottom surfaces 81 and 82 of the trenches 7 will not be etched by the etching of the polysilicon film 3. This causes no change in the shapes of the trenches 7 for use as alignment marks, thereby preventing a decrease in alignment accuracy during the photolithography process.

Besides, in the process step shown in FIG. 6 according to the first preferred embodiment, anisotropic etching is employed for partial removal of the insulation film 30 in the trenches 7. If, in the process step of FIG. 6, isotropic etching by wet processing is employed, it will, in general, be difficult to leave the insulation film 30 on the side surfaces 81 of the trenches 7 because of great thickness of the insulation film 30. If the etching of the polysilicon film 3 is performed with no insulation film 30 left on the side surfaces 81 of the trenches 7, the side surfaces 81 of the trenches 7 may be etched and thereby the shapes of the trenches 7 may be changed from their design value. In the semiconductor device manufacturing method according to the first preferred embodiment, the use of anisotropic etching in the process step shown in FIG. 6 makes it easier to leave the insulation film 30 on both the side and bottom surfaces 81 and 82 of the trenches 7 than using isotropic etching. This prevents a decrease in alignment accuracy during the photolithography process with more certainty than using isotropic etching.

In the first preferred embodiment, as shown in FIGS. 5 and 6, the process for partially removing the insulation film 30 in the trenches 7 and the pre-etching process are performed in a single process step. The removal of the insulation film 30 in the trenches 7 may be performed after the pre-etching process, but in this case, the photolithography process has to be performed again, which considerably increases the number of process steps. In the semiconductor device manufacturing method according to the first preferred embodiment, on the other hand, both the insulation film 30 in the trenches 7 and the insulation film 30 on the active regions 90 partitioned off by the trenches 17 are etched in a single process step. This requires a smaller number of process steps than when the insulation film 30 in the trenches 7 and the insulation film 30 on the active regions 90 are etched in different process steps. In other words, in the semiconductor device manufacturing method according to the first preferred embodiment, the insulation film 30 on the active regions 90 can also be removed in the process for partially removing the insulation film 30 in the trenches 7 shown in FIGS. 5 and 6. This reduces an increase in the number of process steps to a greater extent than when the insulation film 30 on the active regions 90 is removed in a different process step from that shown in FIGS. 5 and 6.

Second Preferred Embodiment

Figure 15:
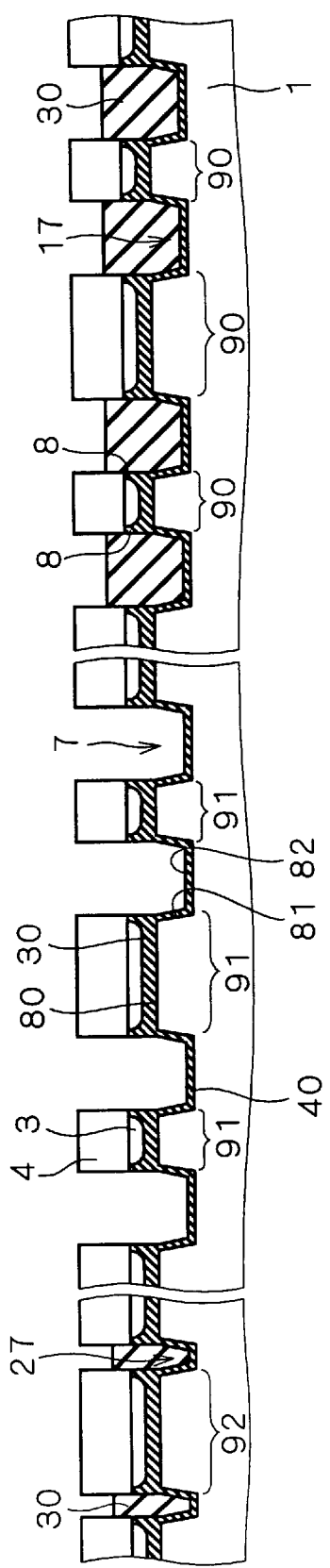
Figure 16:
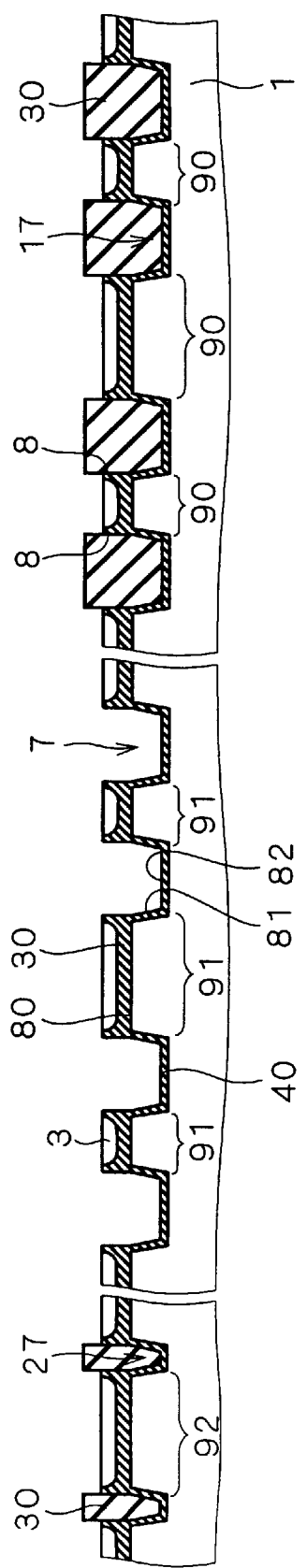
Figure 17:
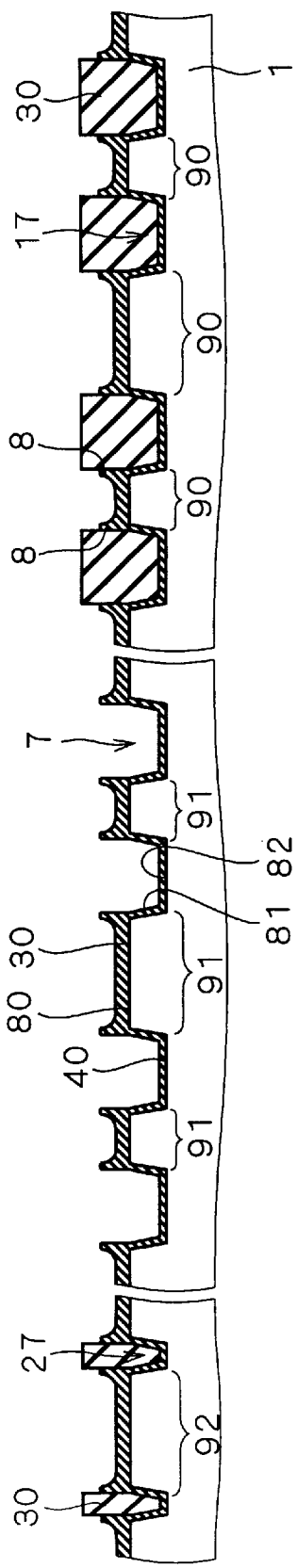

FIGS. 12 to 17 are cross-sectional views illustrating the manufacturing process of a semiconductor device according to a second preferred embodiment of the present invention. The semiconductor device manufacturing method according to the second preferred embodiment differs from that according to the aforementioned first preferred embodiment in the way to form an insulation film on the side and bottom surfaces 81 and 82 of the trenches 7. Hereinbelow, the method of manufacturing a semiconductor device according to the second preferred embodiment will be described in detail. The process steps performed prior to that shown in FIG. 12 and the process step performed after that shown in FIG. 17 are identical to those shown in FIGS. 1 to 5 and 11 and thus the details thereof will not be described herein.

Figure 12:
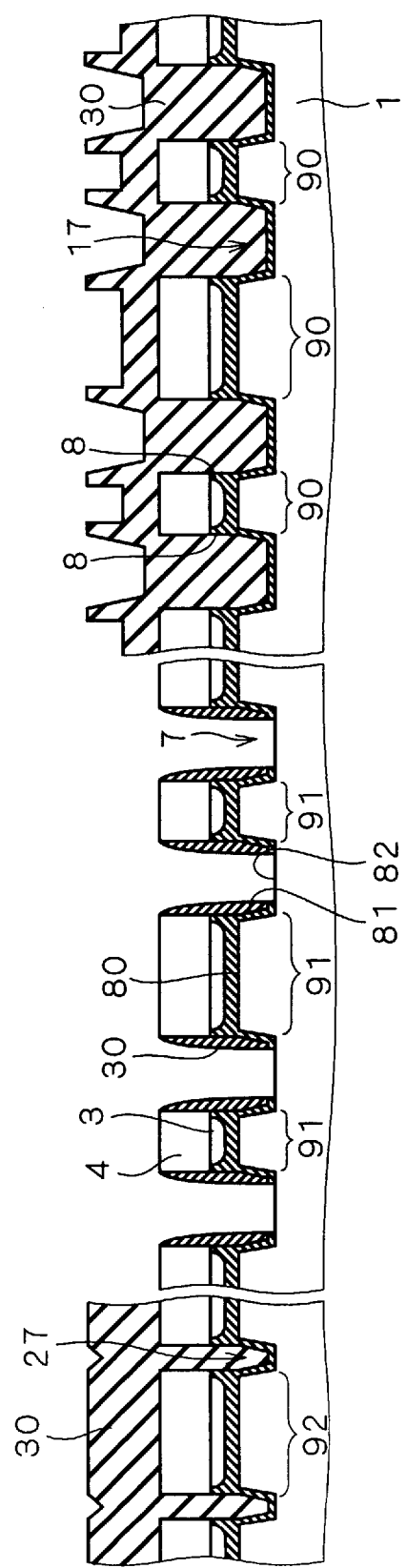
FIGS. 12 to 17 are cross-sectional views illustrating the manufacturing process of a semiconductor device according to a second preferred embodiment of the present invention.

First, as shown in FIGS. 1 and 2, the substrate 1 is prepared, in the surface 80 of which the trenches 7, 17 and 27 are formed and on the surface 80 of which the underlying oxide film 2, the polysilicon film 3 and the silicon nitride film 4 are stacked in layers in this order, avoiding the trenches 7, 17 and 27. Then, as shown in FIGS. 3 to 5 and 12 to 16, an insulation film is formed on the side and bottom surfaces 81 and 82 of the trenches 7. More specifically, as shown in FIGS. 3 and 4, the insulation film 30 is formed on the whole surface of the substrate 1 to fill the trenches 7, 17 and 27 with the insulation film 30. The insulation film 30, as shown in FIGS. 5 and 12 to 14, is then selectively etched to expose the side and bottom surfaces 81 and 82 of the trenches 7. To describe the process steps shown in FIGS. 5 and 12 to 14 in more detail, the resist 11 is formed on the insulation film 30 so as to expose the insulation film 30 on the trenches 7, the insulation film 30 on the active regions 91 of the substrate 1 and the insulation film 30 on the active regions 90 of the substrate 1 as shown in FIG. 5. Using the resist 11 as a mask and the silicon nitride film 4 as an etch stop, as shown in FIG. 12, the insulation film 30 is selectively etched by anisotropic etching to remove part of the insulation film 30 on the active regions 90 of the substrate 1 partitioned off by the trenches 17 (pre-etching process) and thereby to expose the bottom surfaces 82 of the trenches 7. Anisotropic etching employed herein is, for example, reactive ion etching.

Figure 13:
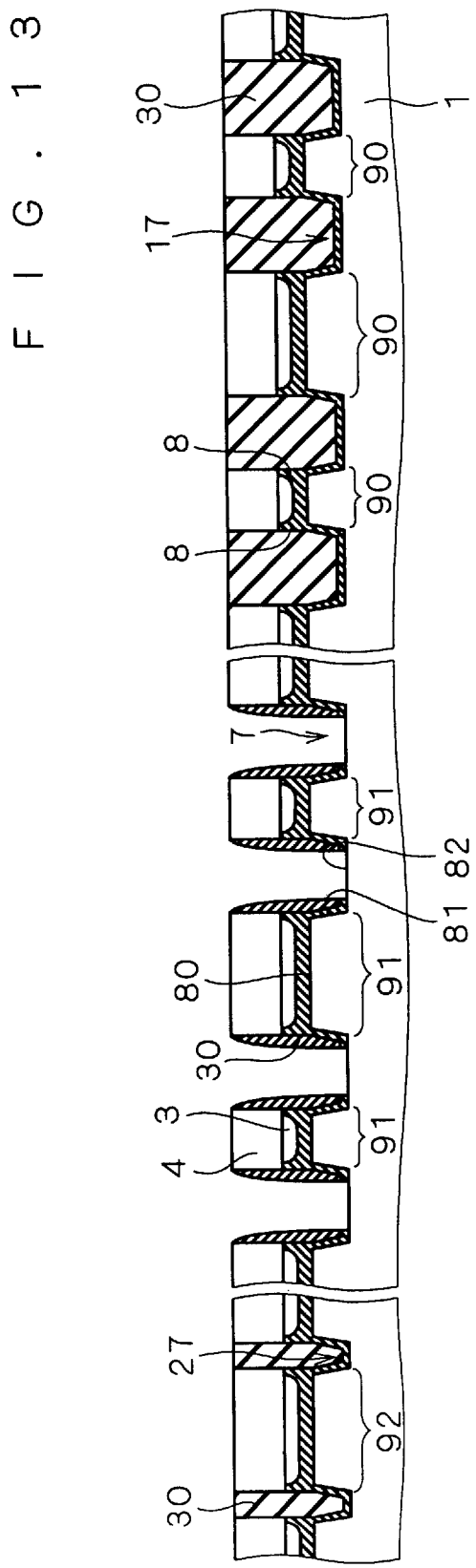
Figure 14:
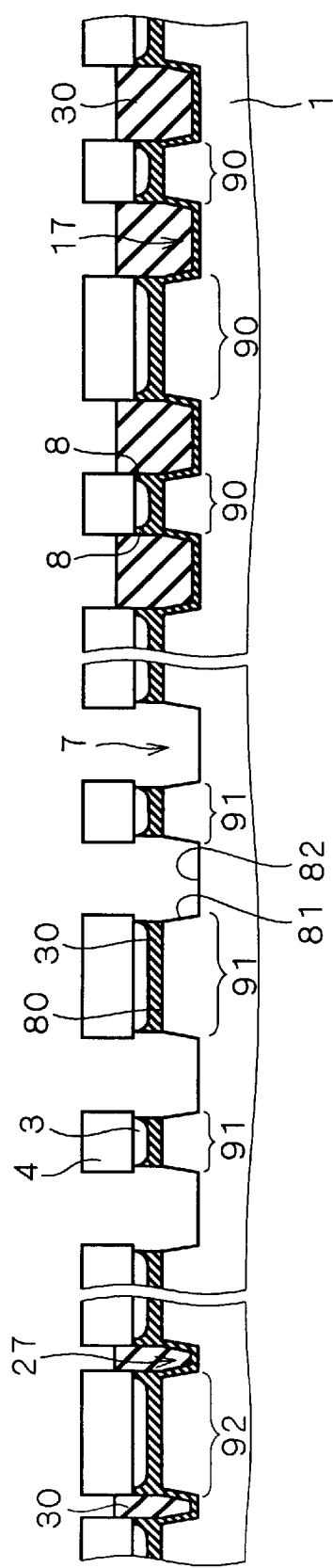

The insulation film 30 is then planarized by CMP as shown in FIG. 13. Then, as shown in FIG. 14, the insulation film 30 is selectively etched by wet processing to remove the insulation film 30 remaining on the side surface of the silicon nitride film 4 and to expose the side surfaces 81 of the trenches 7. In this way, the insulation film 30 is selectively etched to expose the side and bottom surfaces 81 and 82 of the trenches 7.

Then, as shown in FIG. 15, an insulation film 40 is formed on the side and bottom surfaces 81 and 82 of the trenches 7. More specifically, an oxidation process is performed on the structure obtained at the process step shown in FIG. 14 for oxidation of the substrate 1, thereby to cover the side and bottom surfaces 81 and 82 of the trenches 7 with the insulation film 40. Herein, the film thickness of the insulation film 40 in the trenches 7 is determined so that the substrate 1 will not be exposed by etching of the polysilicon film 3 later to be described. The insulation film 40 in the trenches 7 has a film thickness of, for example, approximately 10 to 50 nm. The silicon nitride film 4, as shown in FIG. 16, is then selectively etched for removal by wet processing, for example. In this second preferred embodiment, the insulation film is formed on the side and bottom surfaces 81 and 82 of the trenches 7 in this way.

Next, as shown in FIG. 17, the polysilicon film 3 is selectively etched for removal using the insulation film 40 as a protective film for the substrate 1. At this time, etching is performed using an ammonia-containing solution. Then, as shown in FIG. 11, the insulation film 30 on the active regions 90 to 92 and the insulation film 40 on the trenches 7 are removed to form the gate structure 21, the interlayer insulation film 13 and the contact hole 14. Then, the contact plug 16 is embedded in the contact hole 14 and the interconnection 15 is formed.

As above described, in the semiconductor device manufacturing method according to the second preferred embodiment, in the process steps shown in FIGS. 5 and 12 to 14, the insulation film 30 is selectively etched to expose the side and bottom surfaces 81 and 82 of the trenches 7 and thereafter the insulation film 40 is formed on the side and bottom surfaces 81 and 82 of the trenches 7. In the aforementioned semiconductor device manufacturing method according to the first preferred embodiment, the insulation film 30 on the side and bottom surfaces 81 and 82 of the trenches 7 is left by partial removal of the insulation film 30 in the trenches 7, thereby to form the insulation film on the side and bottom surfaces 81 and 82 of the trenches 7. In general, in order to leave the insulation film 30 on the side and bottom surfaces 81 and 82 of the trenches 7 by controlling the amount of etching, it is necessary to achieve precise control over the amount of etching. From this, in the semiconductor device manufacturing method according to the first preferred embodiment, rigid control over the amount of etching is required for formation of the insulation film on the side and bottom surfaces 81 and 82 of the trenches 7.

On the other hand, the semiconductor device manufacturing method according to the second preferred embodiment requires no control over the amount of etching, since the insulation film 30 is selectively etched to expose the side and bottom surfaces 81 and 82 of the trenches 7 and thereafter the insulation film 40 is formed on the side and bottom surfaces 81 and 82 of the trenches 7. This makes it easier to form the insulation film on the side and bottom surfaces 81 and 82 of the trenches 7 than when the insulation film 30 on the side and bottom surfaces 81 and 82 of the trenches 7 is left by partial removal of the insulation film 30 from the trenches 7.

When a plurality of trenches 7 are formed in the surface 80 of the substrate 1, the aforementioned semiconductor device manufacturing method according to the first preferred embodiment requires uniformalization of the film thickness of the insulation film 30 in all the trenches 7 by controlling the amount of etching. This is not easy because the amount of etching during the etching process generally varies in the wafer surface. Thus, the insulation film 30 in the trenches 7 may in some cases be extremely thin and using such an insulation film 30 for selective etching of the polysilicon film 3 can cause all the insulation film 30 in the trenches 7 and even the substrate 1 to be etched, thereby causing a change in the shape of the trenches 7 from their design value. Accordingly, it may in some cases be difficult to sufficiently prevent a decrease in alignment accuracy during the photolithography process.

In the semiconductor device manufacturing method according to the second preferred embodiment, on the other hand, the side and bottom surfaces 81 and 82 of the trenches 7 are once exposed and the insulation film 40 is formed thereon by a subsequent oxidation process. Although even the insulation film 40 formed by an oxidation process in the trenches 7 has a varying film thickness in the wafer surface, such variation can generally be reduced by controlling the amount of oxidation. That is, variation in the film thickness of the insulation film 40 in the trenches 7 within the wafer surface can be reduced to a greater extent than when, as in the first preferred embodiment, the film thickness of the insulation film 30 in all the trenches 7 is made uniform by controlling the amount of etching during etching of the insulation film 30 in the trenches 7. This ensures prevention of a decrease in alignment accuracy during the photolithography process.

Further in the second preferred embodiment, as shown in FIGS. 5 and 12 to 14, the insulation film 30 is selectively etched to expose the side and bottom surfaces 81 and 82 of the trenches 7. In the process steps shown in FIGS. 5 and 12 to 14, the insulation film 30 on the active regions 90 partitioned off by the trenches 17 is further removed. The process for removing the insulation film 30 on the active regions 90, i.e., the pre-etching process, may be performed prior to the process for exposing the side and bottom surfaces 81 and 82 of the trenches 7, in which case the number of photolithography processes, and consequently the total number of process steps are increased. In the semiconductor device manufacturing method according to the second preferred embodiment, the insulation film 30 is selectively etched to expose the side and bottom surfaces 81 and 82 of the trenches 7 and to remove the insulation film 30 on the active regions 90 partitioned off by the trenches 17; therefore, an increase in the number of process steps can be reduced to a greater extent than when the process for exposing the side and bottom surfaces 81 and 82 of the trenches 7 and the process for removing the insulation film 30 on the active regions 90 are performed in totally different process steps. In other words, in the semiconductor device manufacturing method according to the second preferred embodiment, the insulation film 30 on the active regions 90 partitioned off by the trenches 17 can also be removed in the process for exposing the side and bottom surfaces 81 and 82 of the trenches 7 shown in FIGS. 5 and 12 to 14. This reduces an increase in the number of process steps to a greater extent than when the insulation film 30 on the active regions 90 is removed in a different process step than that shown in FIGS. 5 and 12 to 14.

Third Preferred Embodiment

Figure 18:
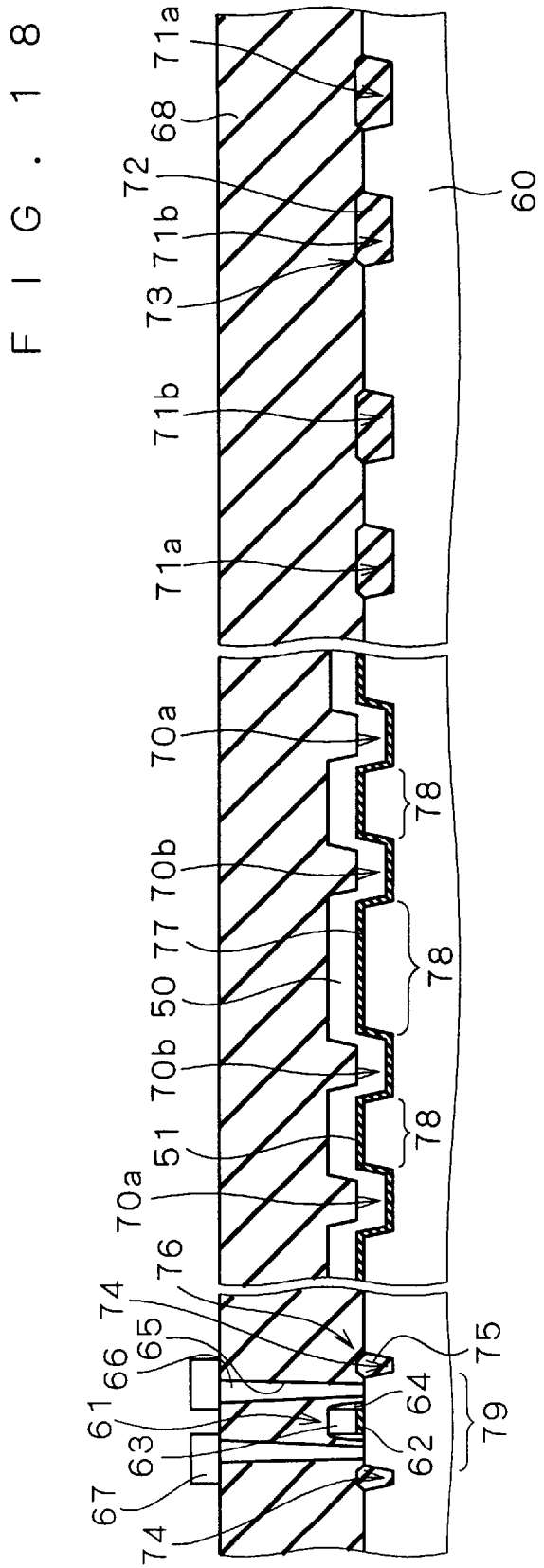
FIGS. 18 to 22 are cross-sectional views illustrating the manufacturing process of a semiconductor device according to a third preferred embodiment of the present invention.

FIG. 18 is a cross-sectional view illustrating in schematic form a configuration of a semiconductor device according to a third preferred embodiment of the present invention. As shown in FIG. 18, the semiconductor device according to the third preferred embodiment includes a substrate 60, in a surface 77 of which trenches 70a and 70b for use as alignment marks, trenches 71a and 71b each forming an element isolation structure 73 and a trench 74 forming an element isolation structure 76 are formed; an insulation film 72 filled in the trenches 71a and 71b; an insulation film 75 filled in the trench 74; an insulation film 51; a gate electrode material 50 formed on the trenches 70a and 70b with the insulation film 51 sandwitched in between; a gate structure 61 selectively formed on an active region 79 of the substrate 60 partitioned off by the trench 74; an interlayer insulation film 68 formed on the substrate 60 to cover the gate structure 61, the gate electrode material 50 and the insulation films 72 and 75; a contact hole 65 formed in the interlayer insulation film 68 to reach the surface 77 of the substrate 60; a contact plug 66 filled in the contact hole 65; and an interconnection 67 formed in contact with the contact plug 66 on the interlayer insulation film 68.

Like the trenches 7a and 7b in the aforementioned first and second preferred embodiments, the trench 70a partitions off, for example, a generally square part of the active region of the substrate 60 and the trench 70b further partitions off a generally square part of the active region partitioned off by the trench 70a. Like the trenches 70a and 70b, the trench 71a partitions off, for example, a generally square part of the active region of the substrate 60 and the trench 71b further partitions off a generally square part of the active region partitioned off by the trench 71a. The trench 74 partitions off, for example, a generally square part of the active region of the substrate 60. Hereinafter, the trenches 70a and 70b may be generically referred to as "trenches 70" and the trenches 71a and 71b as "trenches 71". The trenches 71 and the insulation film 72 form the element isolation structures 73 for use as alignment marks, and the trench 74 and the insulation film 75 form the element isolation structure 76 which provides actual isolation between semiconductor elements.

The aforementioned gate electrode material 50 is also formed on active regions 78 of the substrate 60 partitioned off by the trenches 70. In the specification of the present invention, the active regions 78 partitioned off by the trenches 70 include, in FIG. 18, both the active region partitioned off by the trenches 70a and 70b and the active region partitioned off by the trench 70b.

The gate structure 61 is, for example, a MOS transistor gate structure and includes a gate insulating film 62, a gate electrode 63 made of the gate electrode material 50, and a sidewall 64. The gate electrode material 50 is, for example, polysilicon or tungsten polycide.

Figure 19:
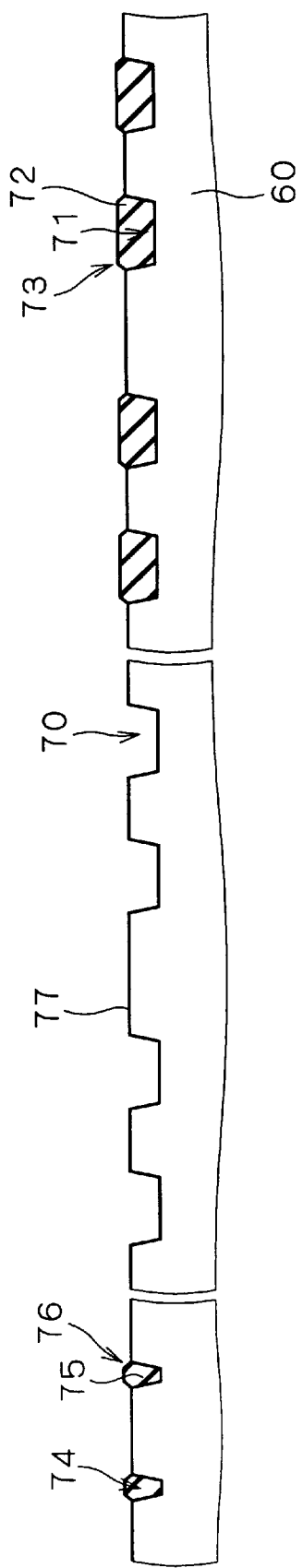
Figure 20:
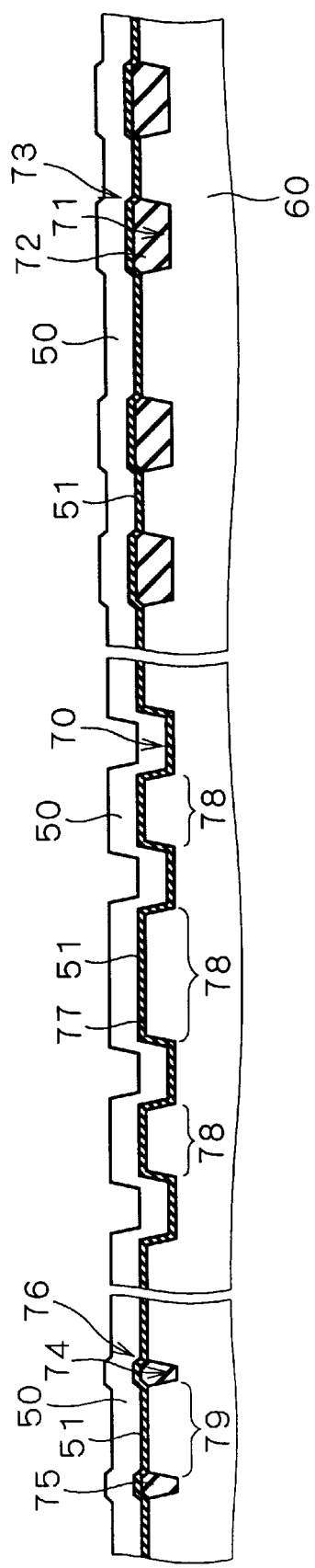
Figure 21:
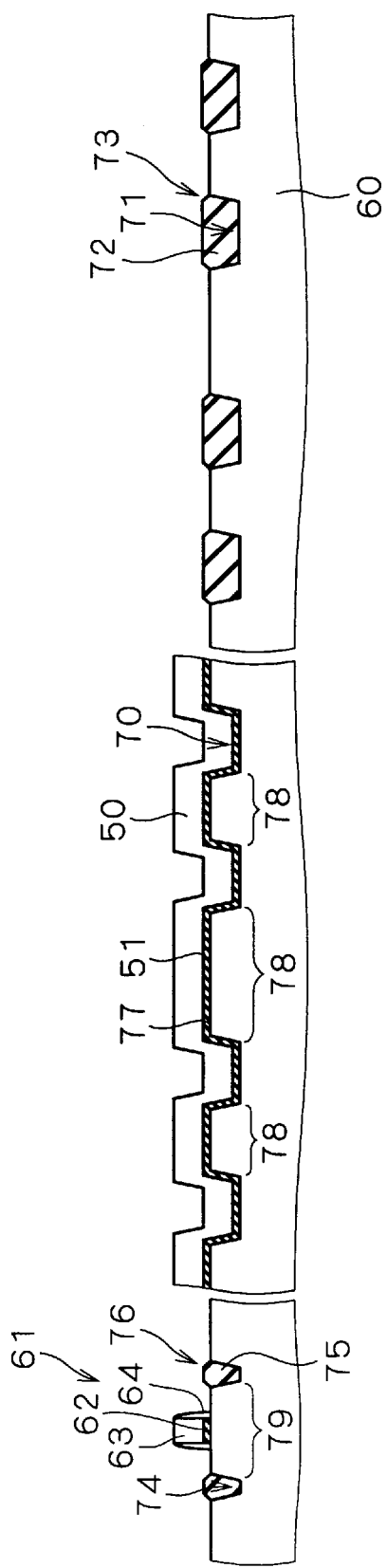

Now, a method of manufacturing a semiconductor device shown in FIG. 18 will be described. FIGS. 19 to 21 are cross-sectional views illustrating the manufacturing process of a semiconductor device according to the third preferred embodiment. As shown in FIG. 19, the substrate 60 is prepared, in the surface 77 of which the trenches 70 for use as alignment marks and the element isolation structures 73 and 76 are formed. The substrate 60 shown in FIG. 19 can be prepared by using, for example, the aforementioned semiconductor device manufacturing method according to either of the first and second preferred embodiment. More specifically, in the use of the semiconductor device manufacturing method according to the first preferred embodiment, the substrate 60 of FIG. 19 can be prepared by removing the insulation film 30 on the trenches 7 and the insulation film 30 on the active regions 90, 91 and 92 from the structure shown in FIG. 10. In the use of the semiconductor device manufacturing method according to the second preferred embodiment, the substrate 60 of FIG. 19 can be prepared by removing the insulation film 40 on the trenches 7 and the insulation film 30 on the active regions 90, 91 and 92 from the structure shown in FIG. 17.

Referring then to FIG. 20, the insulation film 51 is formed on the substrate 60 to cover the trenches 70 and the element isolation structures 73 and 76, and the gate electrode material 50 with a thickness of approximately 100 to 300 nm is formed on the insulation film 51. In other words, the gate electrode material 50 is formed on the substrate 60 with the insulation film 51 sandwiched in between to cover the trenches 70 and the element isolation structures 73 and 76. Then, as shown in FIG. 21, the insulation film 51 and the gate electrode material 50 are selectively etched by photolithography to leave the insulation film 51 and the gate electrode material 50 on the trenches 70 and on the active regions 78, the sidewall 64 is formed, and the gate structure 61 is selectively formed on the substrate 60. The gate insulating film 62 of the gate structure 61 is the insulation film 51 after etching. In the etching of the insulation film 51 and the gate electrode material 50, anisotropic etching is employed, for example. Then, the interlayer insulation film 68 is formed on the substrate 60 to cover the gate structure 61, the gate electrode material 50 and the element isolation structures 73 and 76, and the contact hole 65 reaching the substrate 60 is formed in the interlayer insulation film 68. The contact plug 66 is embedded in the contact hole 65 and the interconnection 67 is formed in contact with the contact plug 66 on the interlayer insulation film 68. Thereby the semiconductor device shown in FIG. 18 is completed.

Figure 22:
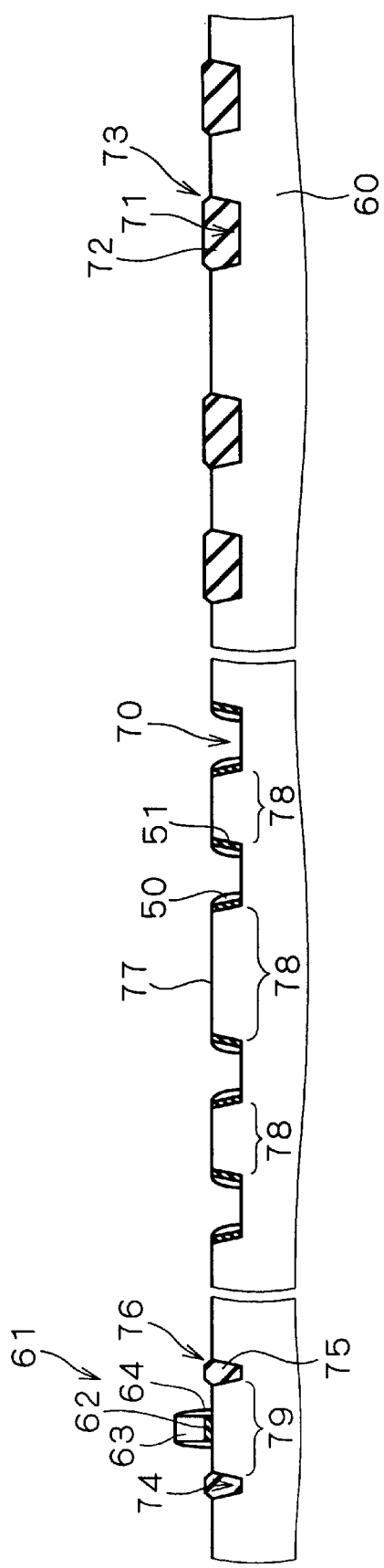

As above described, in the semiconductor device manufacturing method according to the third preferred embodiment, the gate electrode material 50 formed on the trenches 70 are not etched. If, in the process step shown in FIG. 21, the gate electrode material 50 on the trenches 70 is etched, it will be difficult to completely etch the gate electrode material 50 in the trenches 70 and thus, as shown in FIG. 22, the gate electrode material 50 will remain on the side surfaces of the trenches 70. In this case, the trenches 70 each have both a portion where the gate electrode material 50 is formed and a portion where the substrate 60 is exposed, which may result in a decrease in alignment accuracy when the trenches 70 are used as alignment marks. In the semiconductor device manufacturing method according to the third preferred embodiment, on the other hand, the gate electrode material 50 formed on the trenches 70 is not etched, which prevents a situation in which the gate electrode material 50, when being selectively etched, will remain in the trench 70. This prevents a decrease in alignment accuracy during the photolithography process.

To express the above differently, the semiconductor device according to the third preferred embodiment shown in FIG. 18 is manufactured without the etching of the gate electrode material 50 formed on the trenches 70 and therefore can prevent a decrease in alignment accuracy during the photolithography process which would occur if the gate electrode material 50 in the trenches 70 is etched, and as a result, remain in the trenches 70.

In the aforementioned first through third preferred embodiments, the element isolation structures 73, 95 for use as alignment marks and the trenches 7, 70 for use as alignment marks are both formed. However, it goes without saying that the present invention is also applicable to the case where only the trenches 7, 70 are formed as alignment marks.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a substrate having a surface in which a first trench for use as an alignment mark is formed and on which a first film is formed, avoiding said first trench;
   (b) forming a second film on side and bottom surfaces of said first trench; and
   (c) selectively etching said first film using said second film as a protective film for said substrate.

2. The method according to claim 1, wherein
said step (b) includes the steps of:
   (b-1) forming an insulation film on a whole surface of said substrate to fill said first trench with said insulation film; and
   (b-2) selectively etching said insulation film to partially remove said insulation film in said first trench and to leave said insulation film on said side and bottom surfaces of said first trench, and
said second film is said insulation film which remains in said first trench after execution of said step (b-2).

3. The method according to claim 2, wherein
etching performed in said step (b-2) is anisotropic etching.

4. The method according to claim 1, wherein
said step (b) includes the steps of:
   (b-1) forming an insulation film on a whole surface of said substrate to fill said first trench with said insulation film;
   (b-2) selectively etching said insulation film to expose said side and bottom surfaces of said first trench; and
   (b-3) forming a second insulation film on said side and bottom surfaces of said first trench, and
said second film is said second insulation film.

5. The method according to claim 4, wherein
said first trench formed in said surface of said substrate prepared in said step (a) includes a plurality of first trenches, and
in said step (b-3), said second insulation film is formed by oxidation of said substrate on said side and bottom surfaces of each of said first trenches.

6. The method according to claim 2, wherein
in said surface of said substrate prepared in said step (a), a second trench is further formed, which forms an element isolation structure and partitions off an active region of said substrate;
in said step (b-1), aid insulation film is formed on the whole surface of said substrate to also fill said second trench with said insulation film, and
in said step (b-2), said insulation film is selectively etched to further remove said insulation film from said active region partitioned off by said second trench.

7. The method according to claim 4, wherein
in said surface of said substrate prepared in said step (a), a second trench is further formed, which forms an element isolation structure and partitions off an active region of said substrate,
in said step (b-1), said insulation is formed on the whole surface of said substrate to also fill said second trench with said insulation film, and in said step (b-2), said insulation film is selectively etched to further remove said insulation film from said active region partitioned off by said second trench.

8. The method according to claim 6, wherein said element isolation structure is used as an alignment mark.

9. The method according to claim 7, wherein said element isolation structure is used as an alignment mark.

10. A method of manufacturing a semiconductor device, comprising the steps of:

(a) preparing a substrate, in a surface of which a trench for use as an alignment mark is formed;

(b) forming a gate electrode material on said substrate to cover said trench; and (c) selectively etching said gate electrode material while leaving said gate electrode material formed on said trench, to selectively form a gate structure on said substrate.

* * * * *